(12) United States Patent
Geiss et al.

(10) Patent No.: US 7,390,721 B2
(45) Date of Patent: Jun. 24, 2008

(54) METHODS OF BASE FORMATION IN A BICMOS PROCESS

(75) Inventors: Peter J. Geiss, Underhill, VT (US); Marwan H. Khater, Poughkeepsie, NY (US); Qizhi Liu, Essex Junction, VT (US); Randy W. Mann, Poughquag, NY (US); Robert J. Purtell, Mohegan Lake, NY (US); BethAnn Rainey, South Burlington, VT (US); Jae-Sung Rieh, Fishkill, NY (US); Andreas D. Stricker, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 328 days.

(21) Appl. No.: 11/231,385

(22) Filed: Sep. 21, 2005

(65) Prior Publication Data

US 2006/0017066 A1   Jan. 26, 2006

Related U.S. Application Data

(62) Division of application No. 10/708,598, filed on Mar. 13, 2004, now Pat. No. 6,965,133.

(51) Int. Cl.
  *H01L 21/331*   (2006.01)
(52) U.S. Cl. .................. 438/312; 438/320
(58) Field of Classification Search ............. 438/312, 438/320
  See application file for complete search history.

(56) References Cited

U.S. PATENT DOCUMENTS

| | | |
|---|---|---|
| 4,808,548 A | 2/1989 | Thomas et al. |
| 5,017,990 A | 5/1991 | Chen et al. |
| 5,106,767 A | 4/1992 | Comfort et al. |
| 5,144,403 A | 9/1992 | Chiang et al. |
| 5,439,833 A | 8/1995 | Hebert et al. |
| 5,580,798 A | 12/1996 | Grubisich |
| 5,599,723 A | 2/1997 | Sato |
| 5,607,866 A | 3/1997 | Sato et al. |
| 5,661,046 A | 8/1997 | Ilderem et al. |
| 5,940,711 A | 8/1999 | Zambrano |
| 5,953,600 A | 9/1999 | Gris |
| 5,986,323 A | 11/1999 | Zambrano et al. |
| 5,986,326 A | 11/1999 | Kato |
| 6,028,345 A | 2/2000 | Johnson |
| 6,049,098 A | 4/2000 | Sato |
| 6,100,152 A | 8/2000 | Emons et al. |
| 6,316,818 B1 | 11/2001 | Marty et al. |
| 6,465,317 B2 | 10/2002 | Marty |
| 6,492,238 B1 | 12/2002 | Ahlgren et al. |
| 6,642,553 B1 | 11/2003 | Drews et al. |
| 7,087,940 B2 * | 8/2006 | Khater et al. ............ 257/197 |

* cited by examiner

*Primary Examiner*—Jack Chen
(74) *Attorney, Agent, or Firm*—Scully, Scott, Murphy & Presser, P.C.; William D. Sabo, Esq.

(57) ABSTRACT

Methods for fabricating a heterojunction bipolar transistor having a raised extrinsic base is provided in which the base resistance is reduced by forming a silicide atop the raised extrinsic base that extends to the emitter region in a self-aligned manner. The silicide formation is incorporated into a BiCMOS process flow after the raised extrinsic base has been formed. The present invention also provides a heterojunction bipolar transistor having a raised extrinsic base and a silicide located atop the raised extrinsic base. The silicide atop the raised extrinsic base extends to the emitter in a self-aligned manner. The emitter is separated from the silicide by a spacer.

12 Claims, 17 Drawing Sheets

METHODS OF BASE FORMATION IN A BICMOS PROCESS

RELATED APPLICATIONS

This application is a divisional of U.S. application Ser. No. 10/708,598, filed Mar. 13, 2004 now U.S. Pat. No. 6,965,133.

BACKGROUND OF INVENTION

1. Field of the Invention

The present invention relates generally to a bipolar transistor and, more particularly to methods for forming a bipolar transistor with a raised extrinsic base in an integrated bipolar and complementary metal oxide semiconductor (BiCMOS) transistor circuit in which the base resistance is lowered by extending the raised extrinsic base silicide to the emitter region in a self-aligned manner.

2. Background of the Invention

Bipolar transistors are electronic devices with two p-n junctions that are in close proximity to each other. A typical bipolar transistor has three device regions: an emitter, a collector, and a base disposed between the emitter and the collector. Ideally, the two p-n junctions, i.e., the emitter-base and collector-base junctions, are in a single layer of semiconductor material separated by a specific distance. Modulation of the current flow in one p-n junction by changing the bias of the nearby junction is called "bipolar-transistor action."

If the emitter and collector are doped n-type and the base is doped p-type, the device is an "npn" transistor. Alternatively, if the opposite doping configuration is used, the device is a "pnp" transistor. Because the mobility of minority carriers, i.e., electrons, in the base region of npn transistors is higher than that of holes in the base of pnp transistors, higher-frequency operation and higher-speed performances can be obtained with npn transistor devices. Therefore, npn transistors comprise the majority of bipolar transistors used to build integrated circuits.

As the vertical dimensions of the bipolar transistor are scaled more and more, serious device operational limitations have been encountered. One actively studied approach to overcome these limitations is to build transistors with emitter materials whose band gaps are larger than the band gaps of the material used in the base. Such structures are called heterojunction transistors.

Heterostructures comprising heterojunctions can be used for both majority carrier and minority carrier devices. Among majority carrier devices, heterojunction bipolar transistors (HBTs) in which the emitter is formed of silicon (Si) and the base of a silicon-germanium (SiGe) alloy have recently been developed. The SiGe alloy (often expressed simply as silicon-germanium) is narrower in band gap than silicon.

The advanced silicon-germanium bipolar and complementary metal oxide semiconductor (BiCMOS) technology uses a SiGe base in the heterojunction bipolar transistor. In the high-frequency (such as multi-GHz) regime, conventional compound semiconductors such as GaAs and InP currently dominate the market for high-speed wired and wireless communications. SiGe BiCMOS promises not only a comparable performance to GaAs in devices such as power amplifiers, but also a substantial cost reduction due to the integration of heterojunction bipolar transistors with standard CMOS, yielding the so-called "system on a chip."

In addition to high unity current gain frequency fT, state-of-the-art npn HBTs also require a high unity unilateral power gain frequency fmax. Base resistance, Rb, is an important factor that must be lowered in order to obtain a high-performance HBT.

For high-performance HBT fabrication, yielding SiGe/Si HBTs, a conventional way to lower the base resistance is through ion implantation into the extrinsic base. The ion implantation will cause damage, however, to the base region. Such damage may ultimately lead to degradation in device performance.

To avoid the implantation damage, a raised extrinsic base (Rext) is formed by depositing an extra layer of polycrystalline silicon (or SiGe) atop the conventional SiGe extrinsic base layer.

There are essentially two processes that may be utilized to achieve such a raised extrinsic base. The first process involves selective epitaxy; the other involves chemical-mechanical polishing (CMP).

Despite being capable of somewhat lowering the base resistance of prior art HBTs, resistance due to a raised extrinsic base is still a large portion of the overall base resistance. In view of the drawbacks mentioned above with prior art HBTs, there is still a need for developing a method of forming a HBT having a raised extrinsic base in which further lowering of the base resistance is achieved.

SUMMARY OF INVENTION

An object of the present invention is to provide simple, yet practical methods of fabricating a high-performance HBT in an integrated BiCMOS process.

A further object of the present invention is to provide methods of forming a HBT having a raised extrinsic base in which base resistance is further lowered as compared to a conventional HBT having a raised extrinsic base.

A still further object of the present invention is to provide methods of fabricating a high-speed HBT having a raised extrinsic base in which unity current gain frequency fT and unity unilateral power gain frequency fmax can be 200 GHz or greater.

A yet further object of the present invention is to provide methods of fabricating a npn or pnp bipolar transistor in a BiCMOS process flow.

These and other objects and advantages are achieved in the present invention by forming a silicide region over the raised extrinsic base prior to, or after, formation of the emitter. In particular, the methods of the present invention provide means for extending the raised extrinsic base silicide to the emitter region in a self-aligned manner. In the present invention, the polysilicon is emitter is spaced apart from the raised extrinsic base silicide by a spacer. The silicide is self-aligned to the emitter and it exhibits improved, i.e., lowered, resistivity characteristics. Moreover, the silicide region is produced in such a manner so that substantially little or no agglomeration occurs. Agglomeration is defined herein as the action or process of collecting the silicide in a ball, mass or cluster.

One aspect of the present invention is directed to methods of fabricating a high-performance HBT having a raised extrinsic base and a silicide region located on top of the raised extrinsic base. In a first embodiment of the present invention, the method includes the steps of:

forming a base region atop a Si substrate having trench isolation regions located therein, said base region including a monocrystalline region atop the Si substrate and a polycrystalline region atop the trench isolation regions;

forming an oxide layer atop the base region;

forming an emitter pedestal region atop the oxide layer located atop the monocrystalline region;

forming a raised extrinsic base adjacent to said emitter pedestal region;

forming a silicide layer atop the raised extrinsic base; and forming an emitter in said emitter pedestal region, said emitter is spaced apart and isolated from the raised extrinsic base and the silicide layer.

In a second embodiment of the present invention, the extrinsic base silicide is formed in a self-aligned manner to the emitter.

More specifically, the spacing between the emitter edge and the silicide edge is not determined by a lithography step for forming the emitter contact border. Instead, self-alignment of the silicide is achieved by adding a sacrificial oxide layer or any other like material between the extrinsic base polysilicon and an isolation nitride layer. An emitter opening is formed in the stack and a nitride spacer is formed on the sidewalls of the emitter opening. Next, the emitter polysilicon is formed and the emitter contact area is defined with lithography. The oxide stack is stripped and the extrinsic base region is defined with lithography. Next, the sacrificial ozone layer is stripped selective to the isolation nitride layer to create a gap or undercut that extends to the spacer edge. A metal layer is deposited conformally to fill the undercut. The structure is then annealed and a silicide is formed on the exposed silicon surfaces including the area inside the undercut. Metal contacts can then be formed utilizing standard procedures.

Another aspect of the present invention relates to a structure that comprises:

a base region having a monocrystalline region located atop a Si substrate and a polycrystalline region located atop trench isolation regions that are present in the substrate;

a raised extrinsic base located atop the polycrystalline region and part of the monocrystalline region;

a silicide region located atop the raised extrinsic base; and an emitter located atop the monocrystalline region which is spaced apart and isolated from the raised extrinsic base and the polycrystalline region of the base region, wherein said silicide region atop the raised extrinsic base extends to the emitter in a self-aligned manner.

In one embodiment, the silicide region is formed in an undercut that is located beneath the upper "T" region of the emitter. The emitter is separated from the raised extrinsic base silicide by a spacer.

DETAILED DESCRIPTION

Figure 1:
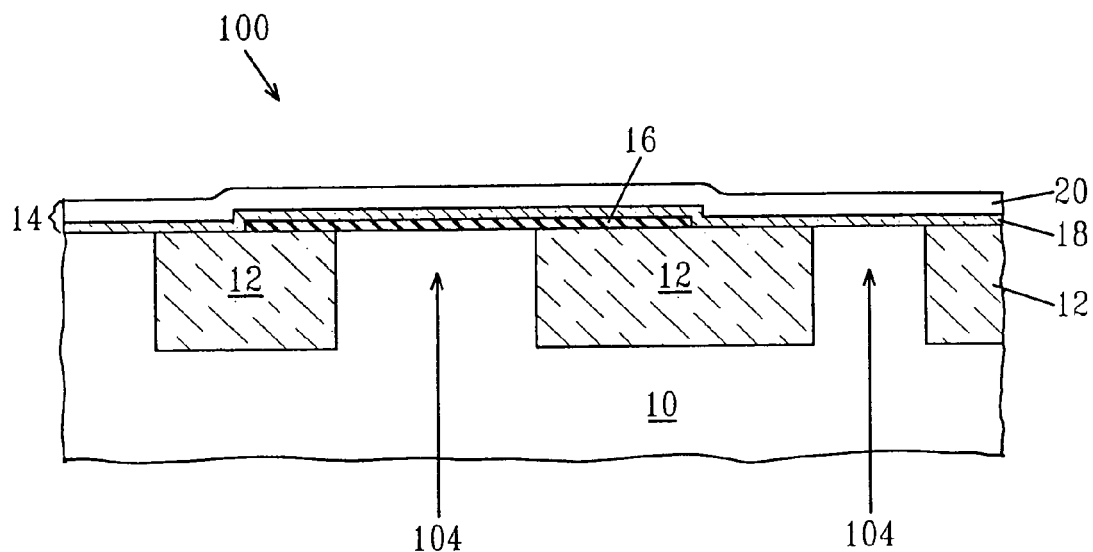
FIGS. 1-11 are pictorial representations (through cross sectional views) illustrating the basic processing steps of the first embodiment of the present invention.

The present invention, which provides methods for fabricating a high-performance heterojunction bipolar transistor (HBT) in a BiCMOS process in which an extended raised extrinsic base silicide is formed in a self-aligned manner in proximity to the emitter as well as the resultant structure that is formed from the inventive methods, will now be described in greater detail by referring to the drawings that accompany the present application.

The drawings of the present application are directed to the HBT device area (although a single HBT device area is shown, the present invention can be employed on a plurality of HBT device areas). For clarity, the CMOS device area as well as other areas of a typically BiCMOS structure are not shown in the drawings. The other areas lay to the periphery of the BiCMOS device area shown. It should be noted that the present invention works equally well for base-after gate processes or base prior to gate processes. Although both processes can be used, it is preferred to employ a base-after gate process. In such a process, the gate of the CMOS transistor is fabricated prior to the formation of the base of the HBT. The following description includes a scheme for use in base-after gate processes.

FIGS. 1-11 are pictorial representations (through cross sectional views) illustrating the basic processing steps of the first embodiment of the present invention. In the first embodiment of the present invention the self-aligned silicide region is formed on exposed portions of the raised extrinsic base prior to the formation of the emitter. A second embodiment of the present invention, which is illustrated in FIGS. 12-22, provides a HBT structure in which the silicide region is formed on the raised extrinsic base after emitter formation. In the second embodiment, portions of the silicide are formed in a gap or undercut that is located beneath the upper region of a T-shaped emitter.

FIG. 1 shows an initial structure of the present invention. The initial structure includes a Si substrate 10 having trench isolation regions 12 formed therein. The Si substrate may be a Si-containing semiconductor substrate such as Si, SiGe, or a silicon-on-insulator (SOI). Alternatively, the Si substrate 10 may be a Si layer such as epi-Si or a:Si formed atop a semiconductor substrate. The Si substrate 10 may include various doping or well regions. The Si substrate 10 may include a sub-collector region which connects the HBT device to an adjacent collector-region.

The trench isolation regions 12 are made using techniques well known to those skilled in the art including, for example, lithography, etching, optionally forming a trench liner, trench filling and planarization. The trench fill material includes a dielectric material such as a high-density oxide or tetraethylorthosilicate (TEOS).

The initial structure also includes protective material 14 atop the HBT device area (in the drawing the HBT device area is designated by reference numeral 100). The protective material 14 includes a nitride layer 16 located mainly above the sub-collector region 102, a protective oxide layer 18 located atop the nitride layer 16 and an amorphous polysilicon layer 20 located atop the protective oxide layer 18. The nitride layer 16 is formed via deposition atop the HBT device area 100 during fabrication of the CMOS transistors. The other layers of the protective material 14 are formed via deposition after the CMOS transistors are formed and those layers, i.e., oxide layer 18 and amorphous polysilicon layer 20, are employed in the present invention to protect the CMOS device area during fabrication of the HBT. Note that the structure of FIG. 1 also includes collector region 104. The collector 104 and a sub-collector (not specifically labeled) are formed in the Si substrate 10 prior to the formation of the CMOS transistors.

Next, the HBT device area 100 is opened by providing a patterned photoresist mask (not shown) having an opening in the HBT device area 100 atop the amorphous polysilicon layer 20 and etching through the opening to remove the exposed portion of the amorphous polysilicon layer 20, underlying oxide layer 18 and underlying nitride layer 16. The patterned photoresist mask is formed by deposition and lithography, while the etching is performed utilizing a reactive-ion etching (RIE) process or another like dry etching process which is capable of stopping atop the upper surface of the Si substrate 10.

Base layer 22 is the formed atop the entire structure including within the opening. See FIG. 2. The base layer 22 is formed by a low temperature epitaxial growth process (typically 450°-700° C.). The base layer 22, which may comprise Si, SiGe or a combination of Si and SiGe, is monocrystalline 22m on top of exposed portions of the Si— substrate 10 and polycrystalline 22p on top of the trench isolation regions 12. The region in which polycrystalline changes over to monocrystalline is referred to as the facet region. The base layer 22 that is formed at this step of the present invention typically has a thickness after epitaxial growth of from about 400 to about 6000 Å. Note that the base layer 22 is thicker atop the Si substrate 10 than atop the isolation trench regions 12.

Figure 2:
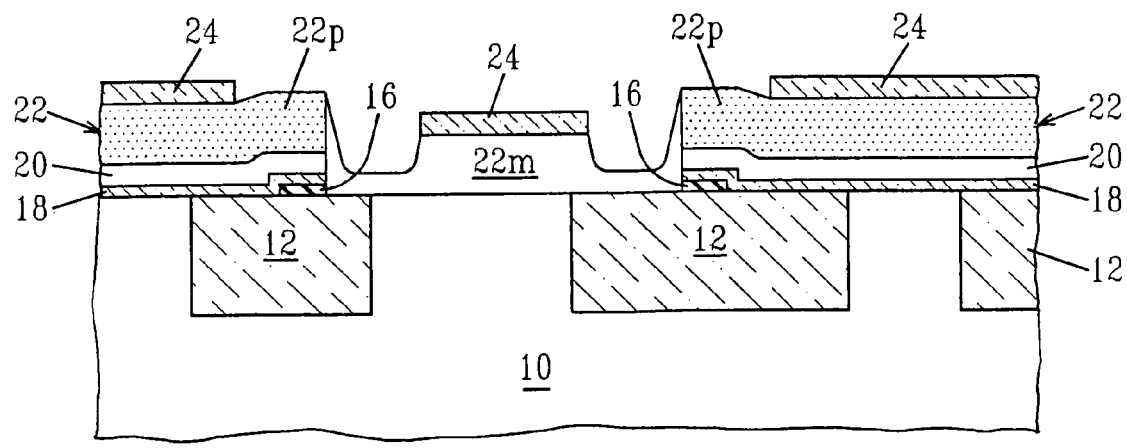

Next, and as also shown in FIG. 2, oxide layer 24 is formed atop the upper horizontal surfaces of base layer 22 including atop the monocrystalline region 22m and the polycrystalline region 22p. The oxide layer 24 is formed using an oxidation process. Alternatively, the oxide layer 24 can be formed by a deposition process such as, for example, chemical vapor deposition (CVD). The oxide layer 24 typically has a thickness after formation of from about 5 to about 50 nm.

After forming oxide layer 24, an emitter pedestal region 26 is formed atop the oxide layer 24 that is located above the monocrystalline 22m portion of the base layer 22. The emitter pedestal region 26 includes a stack of polysilicon 28 and nitride 30 having sidewalls that are protected with insulating spacers 32.

The emitter pedestal region 26 is formed as follows: First a polysilicon layer 28 is formed atop the upper exposed surface of the entire structure shown in FIG. 2. The polysilicon layer 28, which is formed via a deposition process such as chemical vapor deposition (CVD) or plasma-assisted CVD, has a thickness of from about 30 to about 100 nm. Next, a nitride layer 30 is formed atop the polysilicon layer 28 via a conventional deposition process such as chemical vapor deposition (CVD) or plasma-assisted CVD. A patterned photoresist mask (not shown) is then formed atop the nitride layer and portions of the nitride layer that are not protected by the patterned photoresist mask are etched selective to polysilicon. The patterned photoresist mask is removed by a conventional stripping process, and then the pattern in the nitride layer 30 is transferred into the underlying polysilicon layer 28 providing the structure shown, for example, in FIG. 3. The pattern transfer is achieved by utilizing one or more etching processes that are capable of selectively removing polysilicon.

The insulating spacers 32 are then formed on the exposed sidewalls of the material stack of polysilicon and nitride by deposition of an insulating material and etching. Illustrative examples of insulating materials that can be used as the spacers for the emitter pedestal region include: oxides, nitrides and/or oxynitrides, with preference given to nitrides such as SiN.

Figure 3:
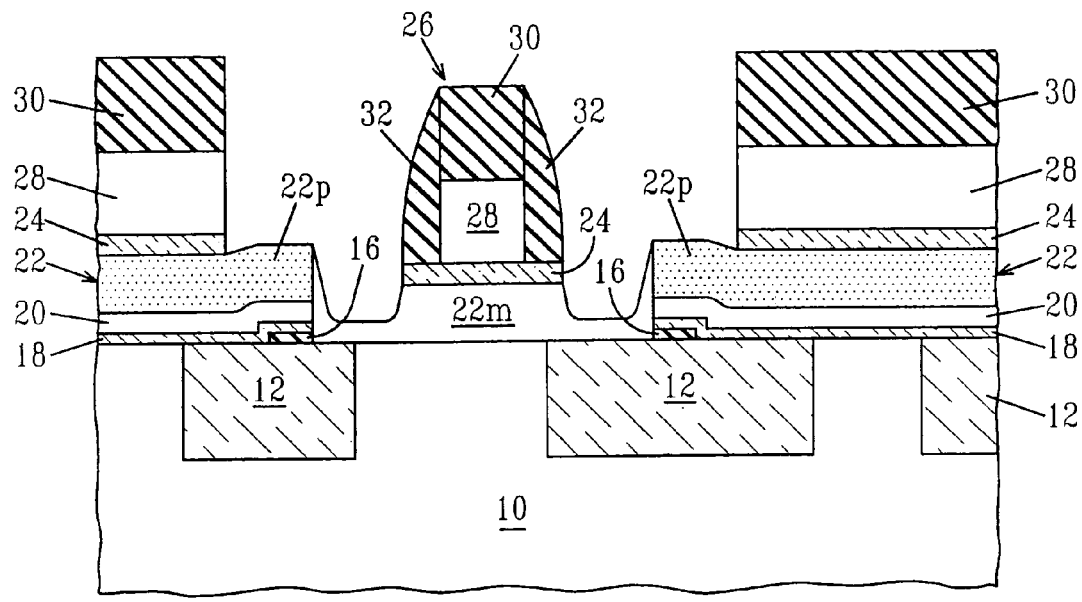
Figure 4:
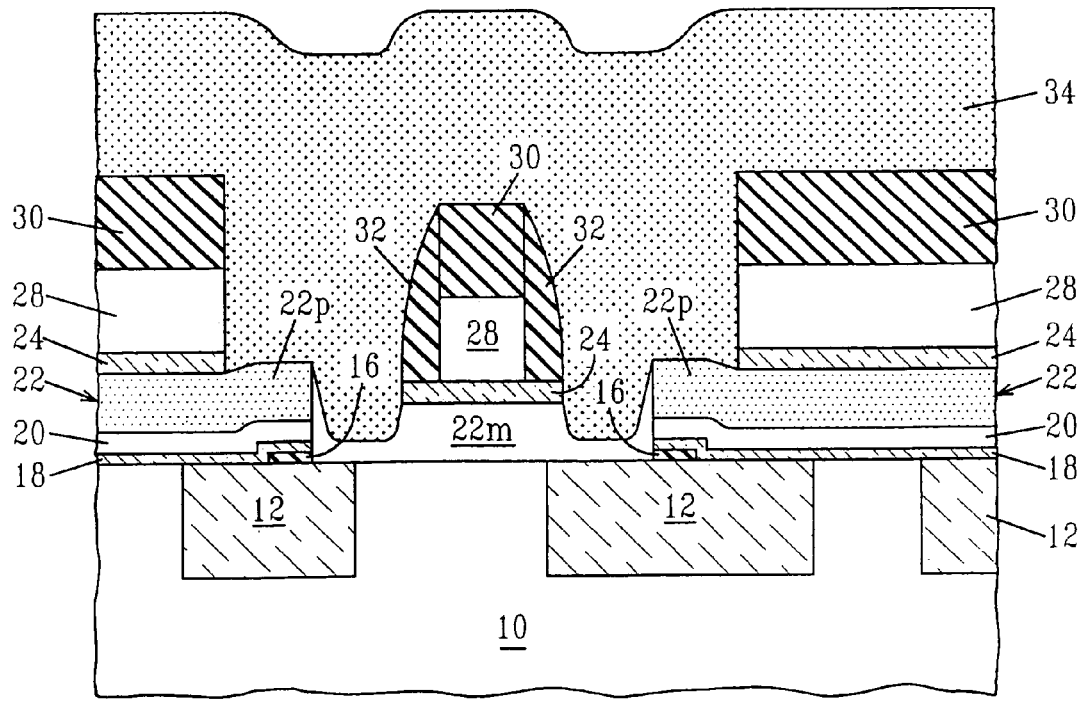

After forming the emitter pedestal region 26 such as shown in FIG. 3, the oxide layer 24 is removed chemically by buffered or diluted HF or an HF-containing chemical. Then, a doped semiconducting layer 34 such as polysilicon, Si or SiGe (hereinafter doped layer 34) is formed on top of the entire structure providing the structure shown, for example, in FIG. 4. The doped layer 34 can be a layer with a variable doping concentration, or Ge composition that can be grown in a state-of-the-art low temperature epitaxy system. The doped layer 34 may also be formed by either an in-situ doped deposition process or by first depositing a polysilicon, Si or SiGe layer and then doping by ion implantation and annealing. In a preferred embodiment of the present invention, an in-situ doping deposition process is utilized. The doped layer 34 typically has a thickness from about 20 to about 400 nm. It is noted that the portions of doped layer 34 that are located above the polycrystalline region 22p of the base layer 22 form the raised extrinsic base of the inventive HBT.

Figure 5:
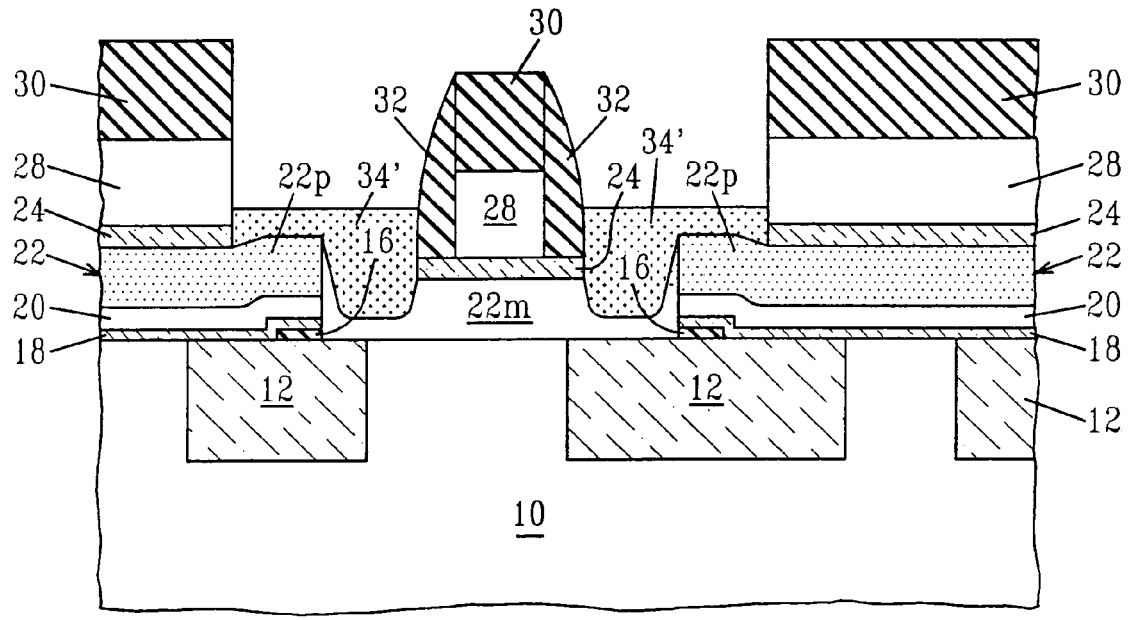

After depositing the doped layer 34, the doped layer 34 is planarized via chemical-mechanical polishing (CMP) to the upper surface of nitride layer 30 and then the planarized doped layer is recessed below the upper surface of the emitter pedestal region 26. The CMP may include the polySi CMP process disclosed, for example, in U.S. Pat. No. 6,492,238 to Ahlgren, et al., the entire contents of which are incorporated herein by reference. The structure including the recessed doped layer 34 is shown in FIG. 5. In FIG. 5, the recessed doped layer 34 is designated as 34" indicating the formation of the raised extrinsic base upon the polycrystalline region 22p of the base layer 22. The recessing used in the present invention for forming the raised extrinsic base 34" comprises a timed RIE process.

Figure 6:
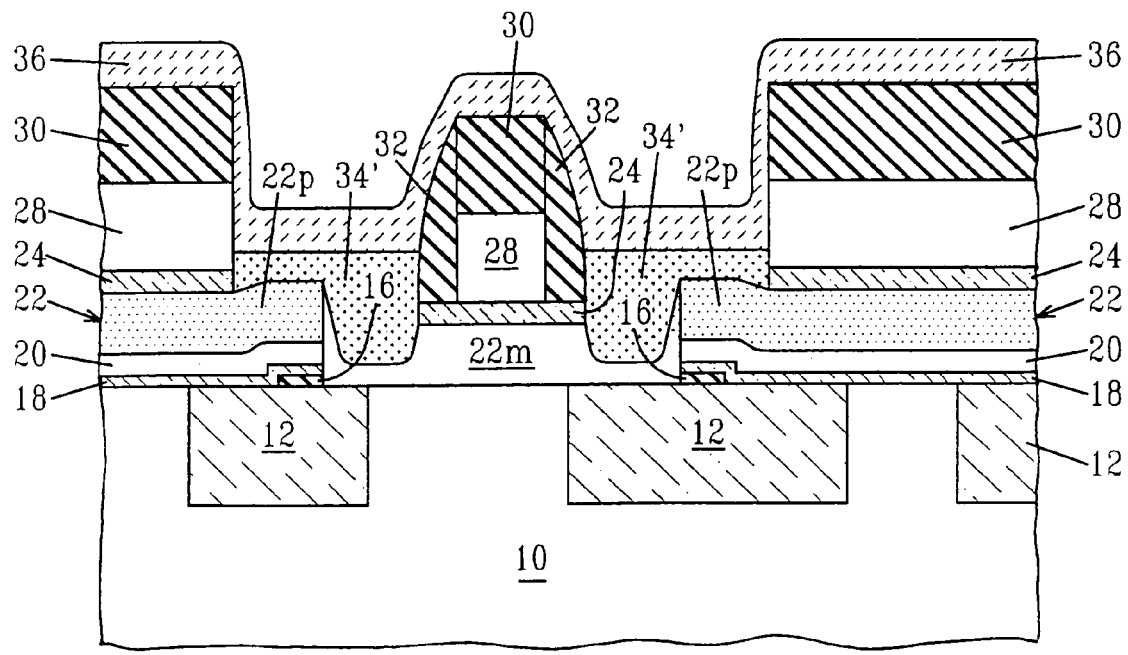
Figure 7:
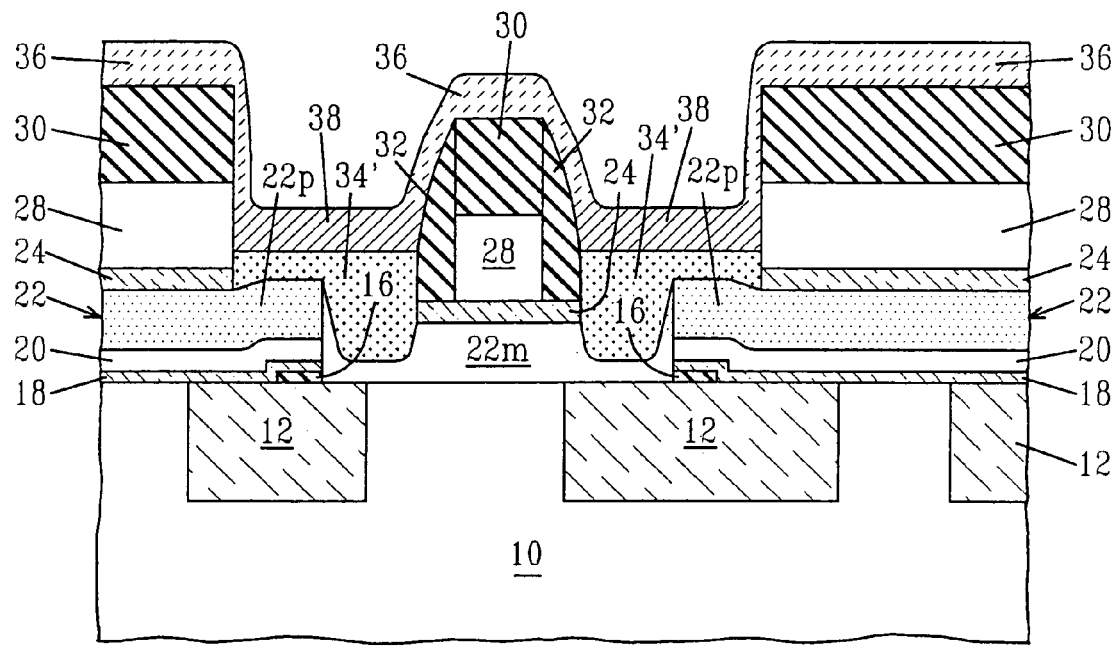

After forming the raised extrinsic base 34" atop the polycrystalline region 22p of the base layer 22, a refractory metal layer 36 is deposited on the exposed surfaces of the structure shown in FIG. 5 providing the structure illustrated in FIG. 6. The refractory metal layer is formed by a conventional deposition process including, for example, CVD, plasma-assisted CVD, sputtering, atomic layer deposition, and chemical solution deposition. The refractory metal layer 36 has a thickness after deposition of from about 4 to about 60 nm.

The term "refractory metal" is used herein to denote a metal-containing material (i.e., elemental metal or metal alloy) that is difficult to corrode or fuse, yet is capable of forming a silicide when reacted with silicon at high-temperatures. Examples of refractory metals that may be employed in the present invention include, but are not limited to: Ti, Co, W, Ta, Ni and alloys thereof. The term "alloys" is used herein to denote a mixture of elemental metals as well as an elemental metal that includes an alloying additive. Highly preferred refractory metals are Ti, Co and Ni, with Co being most highly preferred.

The structure including the refractory metal layer 36 is then annealed to form a metal silicide region that is in its lowest resistivity phase. For some of the elemental metals such as Ni a single annealing step is needed to convert the refractory metal layer into a low-resistance silicide region, while for other elemental metals such as Ti a first annealing step is used to convert the Ti into a Ti silicide phase of high resistance and then a second anneal is used to convert the high resistance Ti silicide phase into its lowest resistance phase.

The first anneal step is typically performed at a temperature from about 400° C. to about 700° C. for a time period from about ½ minute to about 30 minutes. The anneal is typically carried out in an inert gas ambient such as He, Ar, Ne, Xe, Kr, $N_2$ or a mixture thereof. A single ramp-up rate, with or without soaking, may be employed in the present invention or multiple ramp-up rates, with or without soaking, may be employed in the present invention.

During the first anneal (or during any of the annealing processes mentioned herein), the refractory metal interacts and reacts with the underlying portions of raised extrinsic base 34" to form a silicide. During the interaction and subsequent reaction most of the refractory metal and some of the raised extrinsic base gets consumed. The structure including a metal silicide 38 is shown, for example, in FIG. 7. Metal silicide 38 shown in FIG. 7 may or may not be in its lowest resistivity phase.

Figure 8:
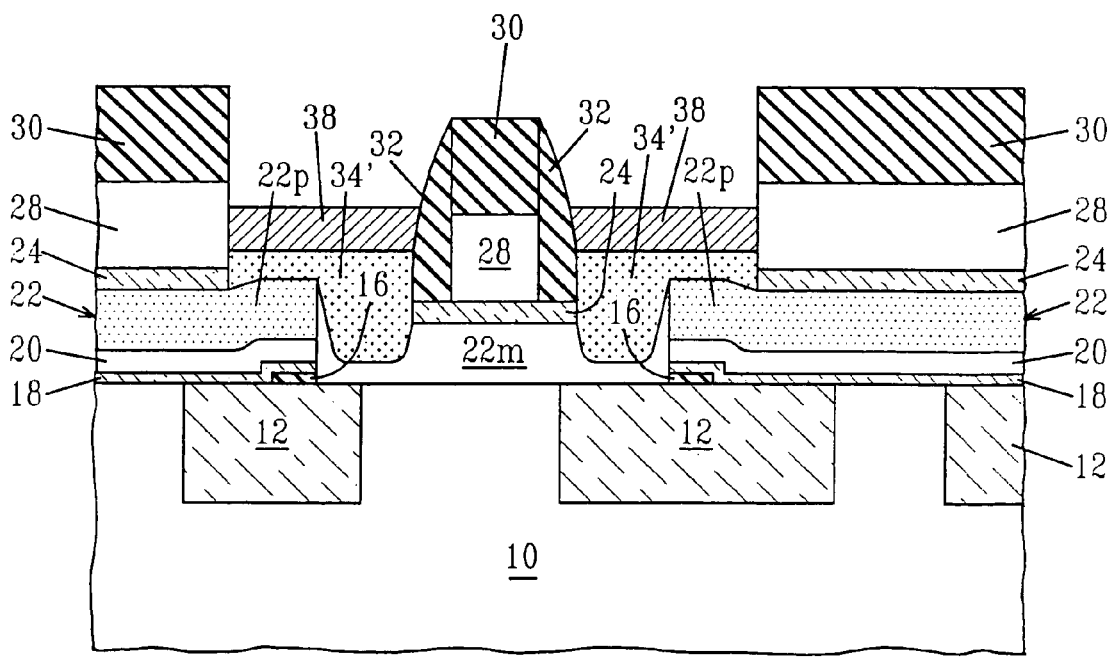

Following the first anneal, any unreacted metal is removed utilizing a chemical etchant such as an inorganic acid providing the structure shown, for example, in FIG. 8. Note that the refractory metal 36 atop nitride layer 30 is removed during this processing step of the present invention.

Figure 9:
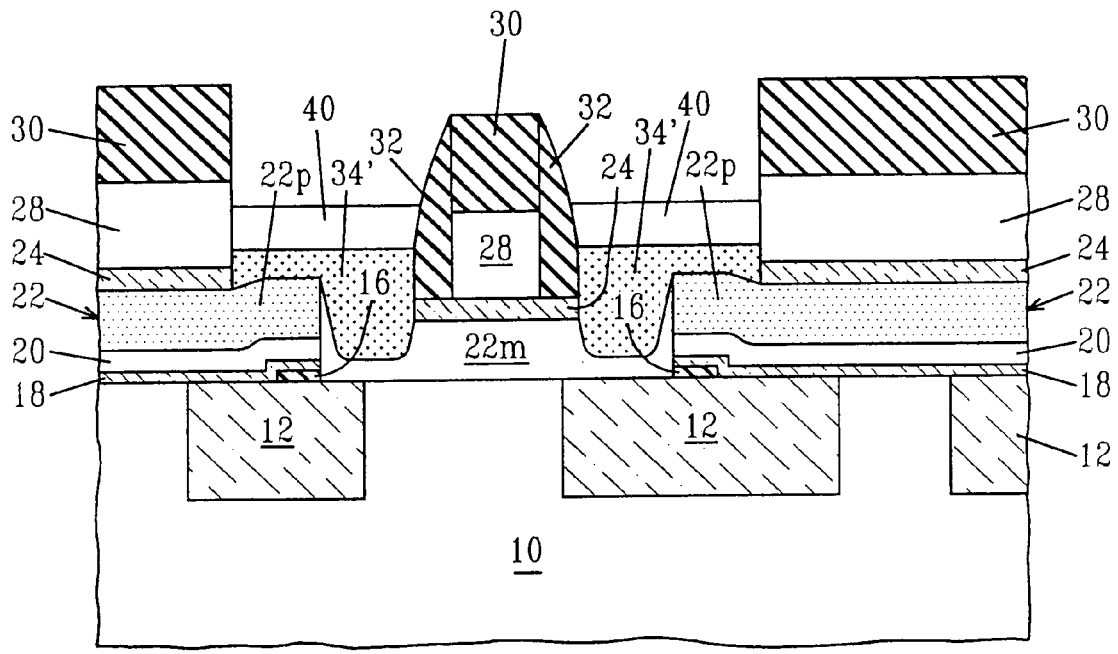

If needed, a second annealing step may now be conducted to convert the previously formed metal silicide 38 into a lower resistance silicide 40. The resultant structure that is formed after the second annealing step has been performed is shown in FIG. 9. The second annealing is typically performed at a temperature from about 700° C. to about 950° C. for a time period from about 10 seconds to about 5 minutes. The second anneal is typically carried out in an inert gas ambient such as He, Ar, Ne, Xe, Kr, $N_2$ or a mixture thereof. A single ramp-up rate, with or without soaking, may be employed in the present invention or multiple ramp-up rates, with or without soaking, may be employed in the present invention.

Figure 10:
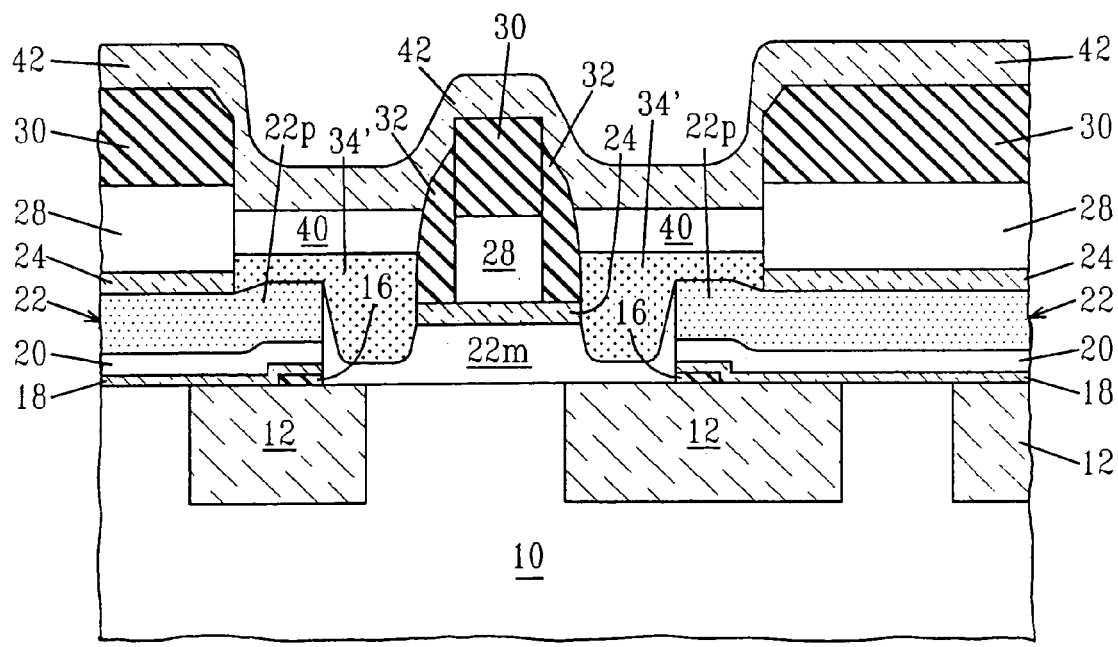

After silicide formation in which silicide (38 or 40) is formed on the raised extrinsic base, an isolating oxide layer 42 is formed over the structure shown in FIG. 9 providing the structure illustrated in FIG. 10. The isolating oxide layer 42 is composed of tetraethylorthosilicate (TEOS) or $SiO_2$ and it is typically formed by a conventional deposition process that is well known to those skilled in the art. The thickness of the isolating oxide layer 42 may vary, but typically isolating oxide layer 42 has a thickness of from about 100 to about 300 nm.

After providing the isolating oxide layer 42, an oxide chemical mechanical polishing (CMP) process such as disclosed, for example, in U.S. Pat. No. 6,492,238 to Ahlgren, et al., the entire contents of which are incorporated herein by reference, is performed and thereafter an emitter region 44 is formed into the area that includes the emitter pedestal region 26. Specifically, the emitter region 44 is formed by first selectively removing portions of the isolating oxide layer 42 that overlay the emitter pedestal region 26. This is achieved in the present invention by utilizing a patterned photoresist mask and etching the exposed portions of the isolating oxide layer 42 stopping atop the nitride layer 30. After the initial etching step, the patterned photoresist mask is removed and then the exposed nitride layer 30 is selectively removed utilizing a chemical etchant that is highly selective in removing nitride as compared to oxide or polySi. The etching step stops atop polysilicon layer 30. The polysilicon layer 30 is then removed utilizing an etching step that is highly selective in removing polysilicon as compared to nitride. This etching stops atop oxide layer 22.

The exposed oxide layer 22 is then etched utilizing a chemical oxide removal (COR) process or similar process that induces minimal undercut or substantially no undercut is formed. In the COR process, a gaseous mixture of HF and ammonia is employed. The ratio of HF to ammonia employed in the COR process is typically from 1:10 to 10:1, with a ratio of 2:1 being more highly preferred. Moreover, the COR process employed in the present invention is performed at a pressure between about 1 mTorr to about 100 mTorr and at a temperature of about 25° C. As is depicted, the COR process provides minimal or substantially no undercut region beneath the insulating spacers 32. An optional HF-containing chemical cleaning step may follow the COR process.

Figure 11:
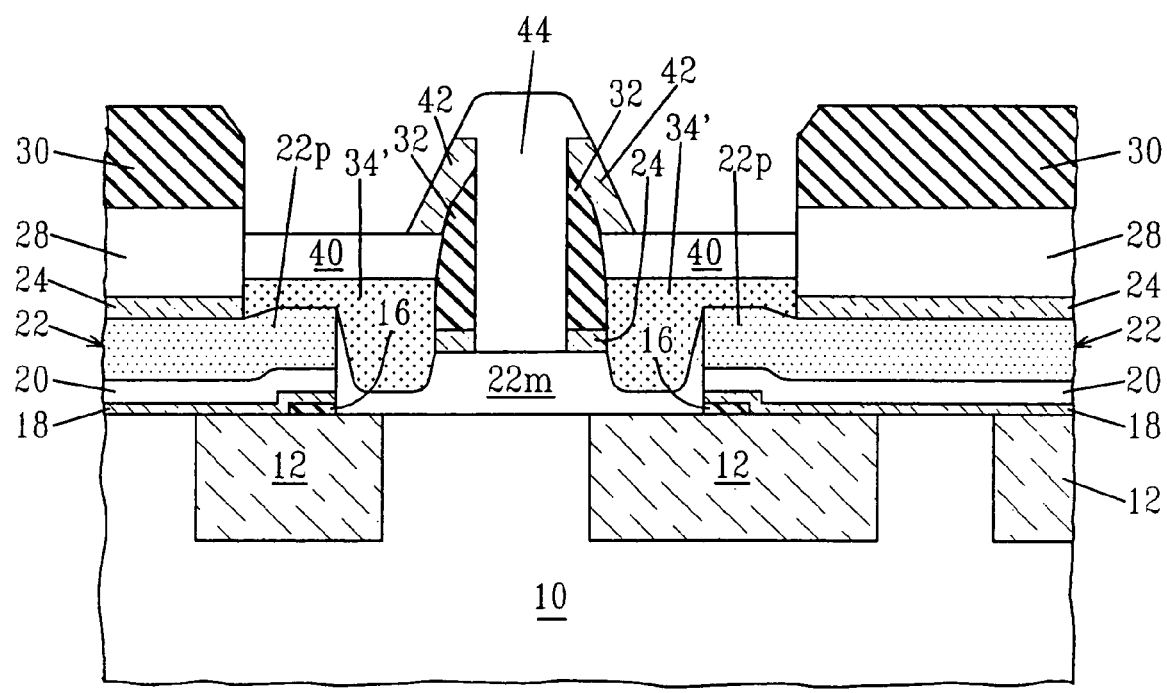

After the COR process and the optional HF-containing chemical cleaning step, an emitter polysilicon 44 is deposited and patterned providing the structure shown, for example, in FIG. 11. The emitter polysilicon is a doped polysilicon material that can be formed utilizing an in-situ doping deposition process or deposition, followed by ion implantation and annealing. Note that the emitter polysilicon is in contact with the monocrystalline portion 22m of the base layer 22. It is noted that the doping of the emitter polysilicon 44, the base 22 and the collector can be tailored to provide either an npn or a pnp HBT, with preference given herein to npn HBT transistors.

It is noted that in the structure shown, for example, in FIG. 11, the silicide region 40 atop the raised extrinsic base extends to the emitter 44 in a self-aligned manner and the silicide 40 exhibits improved, e.g., lowered, resistivity characteristics. Moreover, the silicide 40 is produced in the first embodiment of the present invention such that substantially little or no agglomeration occurs.

As stated above, FIGS. 1-11 show the processing steps that are employed in a first embodiment of the present invention. In the first embodiment of the present invention, the silicide region is formed prior to emitter formation. As shown in FIG. 11, an inner edge of the silicide region 40 is in contact with the insulating spacers 32 which isolate the silicide region 40 from the emitter 44. In addition to the first embodiment depicted above, the present invention also contemplates a second method of forming a HBT structure having the extrinsic base silicide (i.e., silicide region 40) formed in a self-aligned manner to emitter 44. In the second embodiment of the present invention, the silicide is formed after formation of the emitter and it is formed in a gap or undercut that is located beneath an upper portion of the T-shaped emitter. As in the first embodiment, the raised extrinsic base silicide extends to the emitter in a self-aligned manner.

Figure 12:
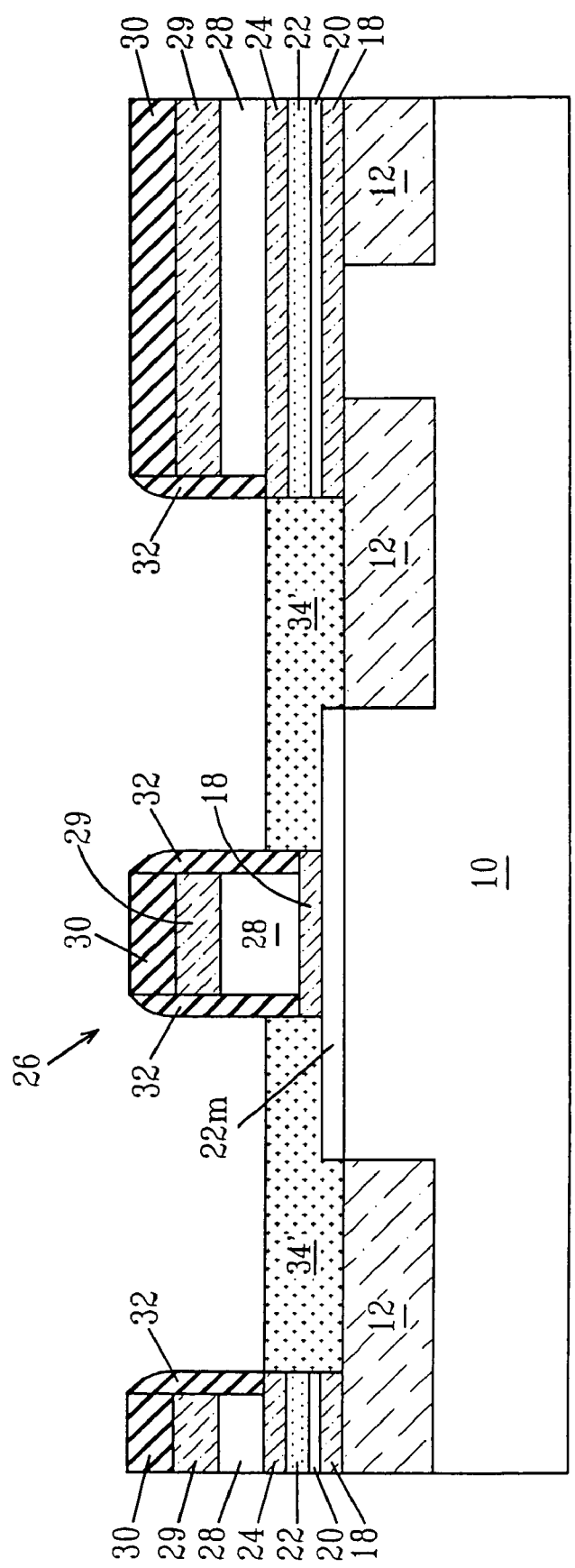
FIGS. 12-22 are pictorial representations (through cross sectional views) illustrating the basic processing steps of the second embodiment of the present invention.

The second embodiment of the present invention, which is shown in FIGS. 12-22, will now be described in greater detail. Reference is first made to the structure shown in FIG. 12. The structure shown in FIG. 12 includes the various elements that are depicted in FIG. 5 of the first embodiment of the present invention. It is noted that the various processing steps described in the first embodiment for forming the structure shown in FIG. 5 are used in the second embodiment for forming the structure shown in FIG. 12 except for the fact that oxide layer 29 is formed between polysilicon layer 28 and nitride layer 30. The oxide layer 29 is formed via a conventional deposition process. In FIG. 12, the listed reference numerals are the same as those used above in forming the structure shown in FIG. 5. For clarity, portions of the polycrystalline extrinsic base region and the doped layer that form the raised extrinsic base have been combined and are labeled as 34".

Figure 13:
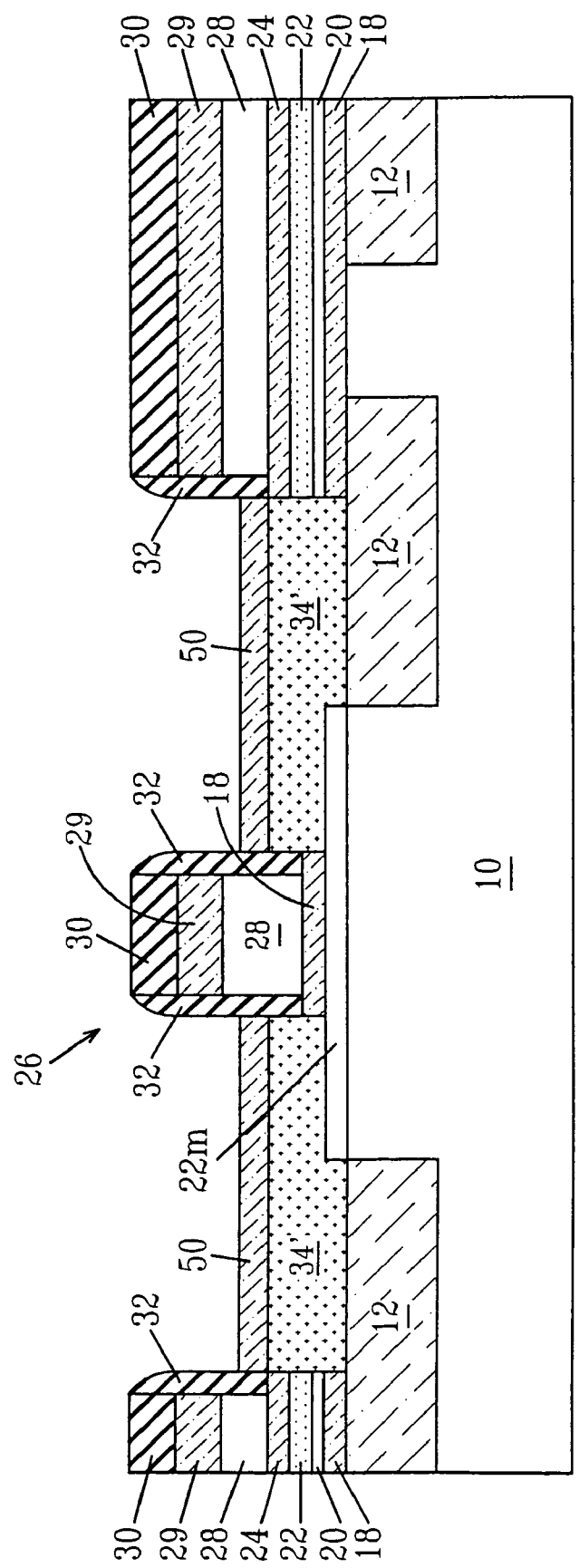

FIG. 13 shows the structure that is formed after a sacrificial oxide layer 50 is formed on the exposed surface of the raised extrinsic base 34. The sacrificial oxide layer 50 is formed by deposition, chemical mechanical polishing and recessing. It is noted that the thickness of the sacrificial oxide layer 50 determines the thickness of the silicide region to be subsequently formed. The sacrificial oxide layer 50 may be composed of ozone TEOS or any other like oxide material.

Figure 14:
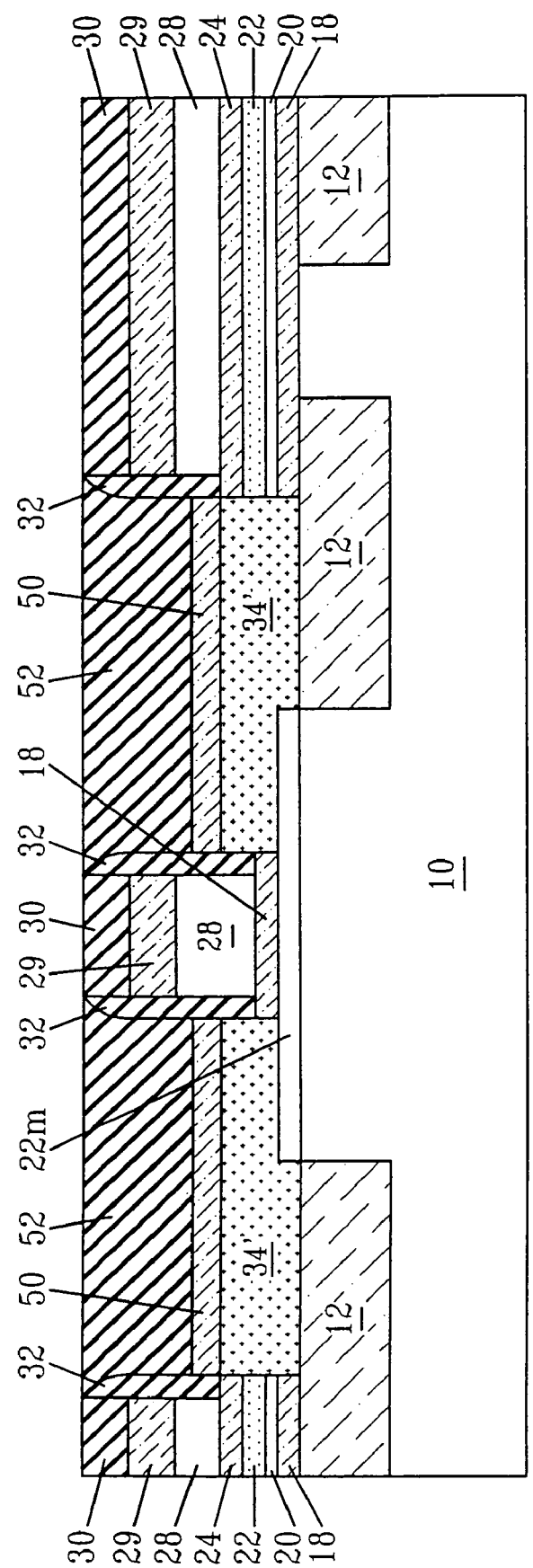

After forming the sacrificial oxide layer 50 on the structure so as to provide the structure shown in FIG. 13, a nitride layer 52 is then deposited and the deposited nitride layer 52 is planarized to provide the planar structure shown in FIG. 14. In the planar structure shown in FIG. 14, the exposed upper surfaces of the structure are composed of nitride, e.g., nitride layers 30 and 52.

Next, the nitride layers are opened by chemical mechanical polishing (CMP) or etching utilizing oxide layer 29 as a polish stop layer or an etch stop layer. The resultant structure formed after this step of the second embodiment of the present invention has been performed is shown, for example, in FIG. 15. In the structure shown in FIG. 15, the upper surface layer now comprises nitride that is located above the raised extrinsic base 34" and oxide layer 29.

Figure 15:
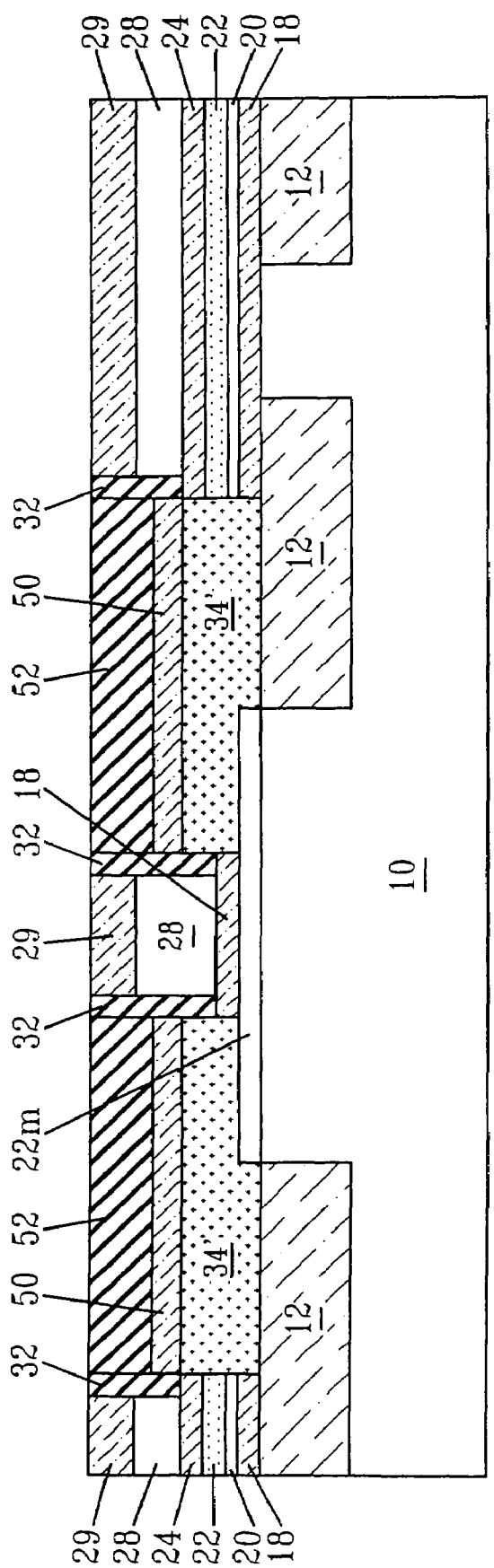
Figure 16:
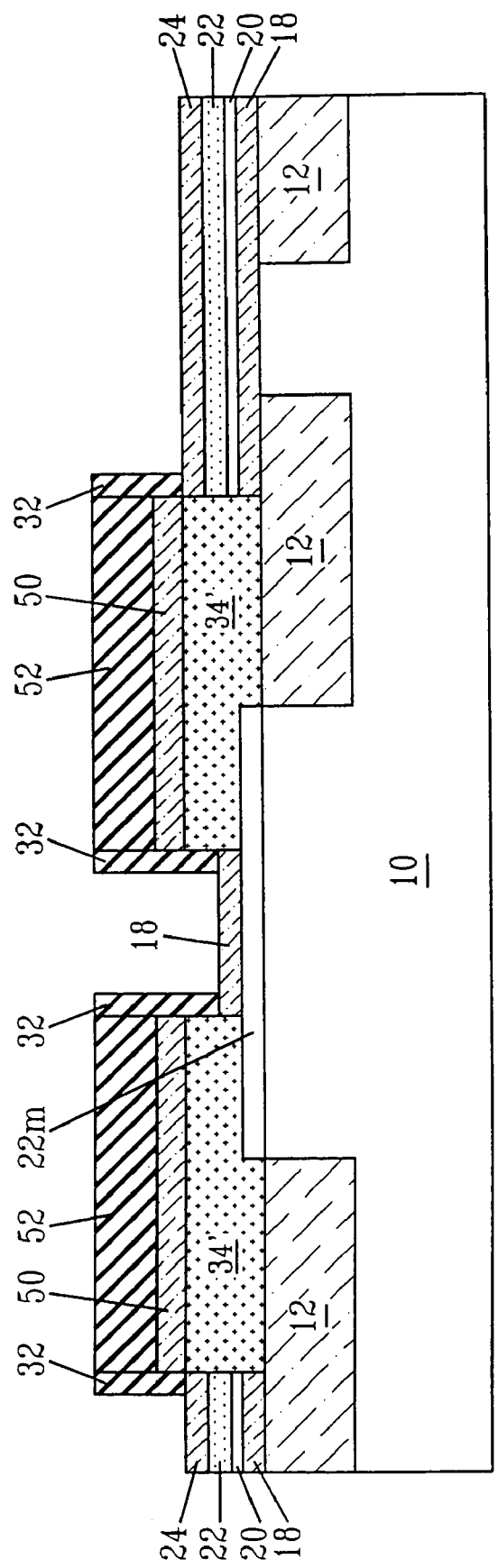

The oxide layer 29 that is exposed in FIG. 15 together with the underlying polysilicon layer 28 of the emitter pedestal region 26 are then removed by reactive ion etching or wet chemical etching to provide the structure shown in FIG. 16. In FIG. 16, oxide layer 24 of the emitter pedestal region 26 that lies above the monocrystalline 22m base region 22 is exposed.

Figure 17:
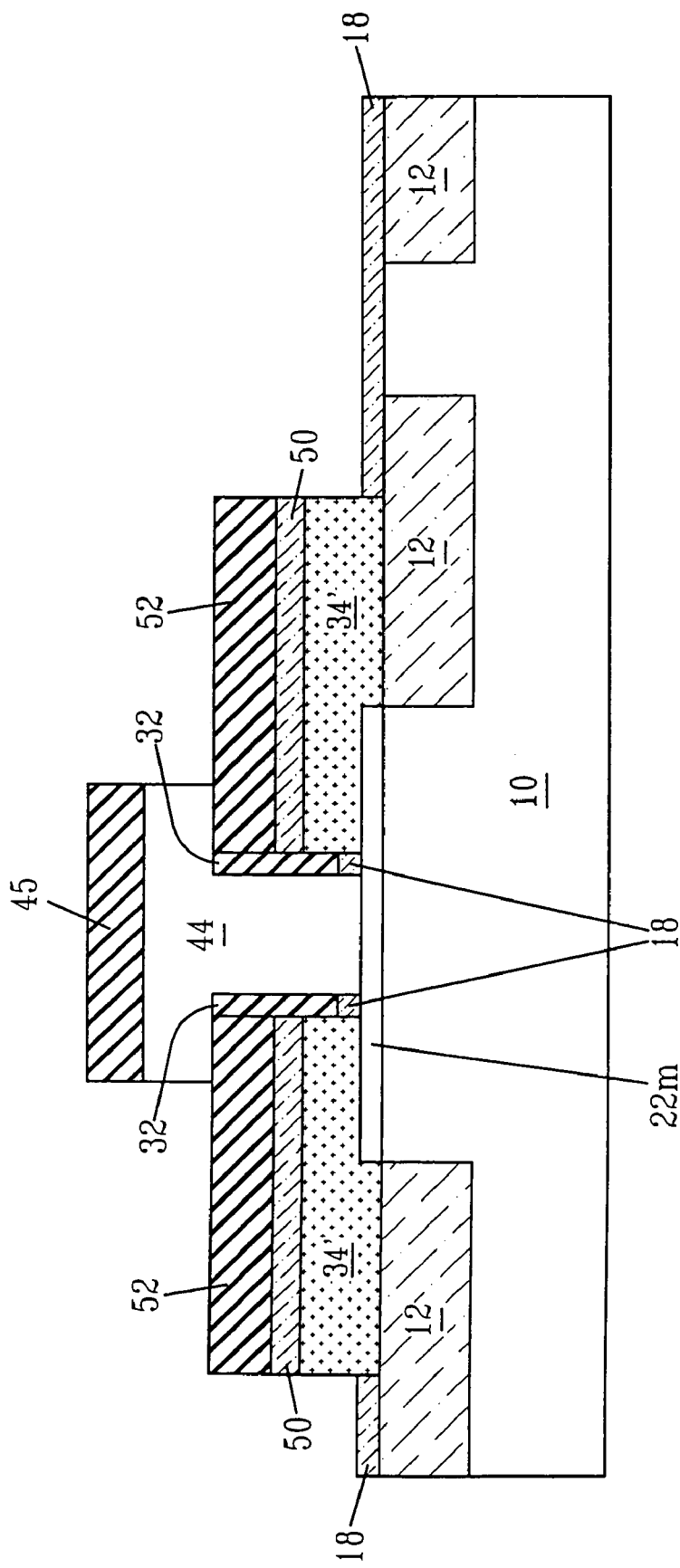
Figure 18:
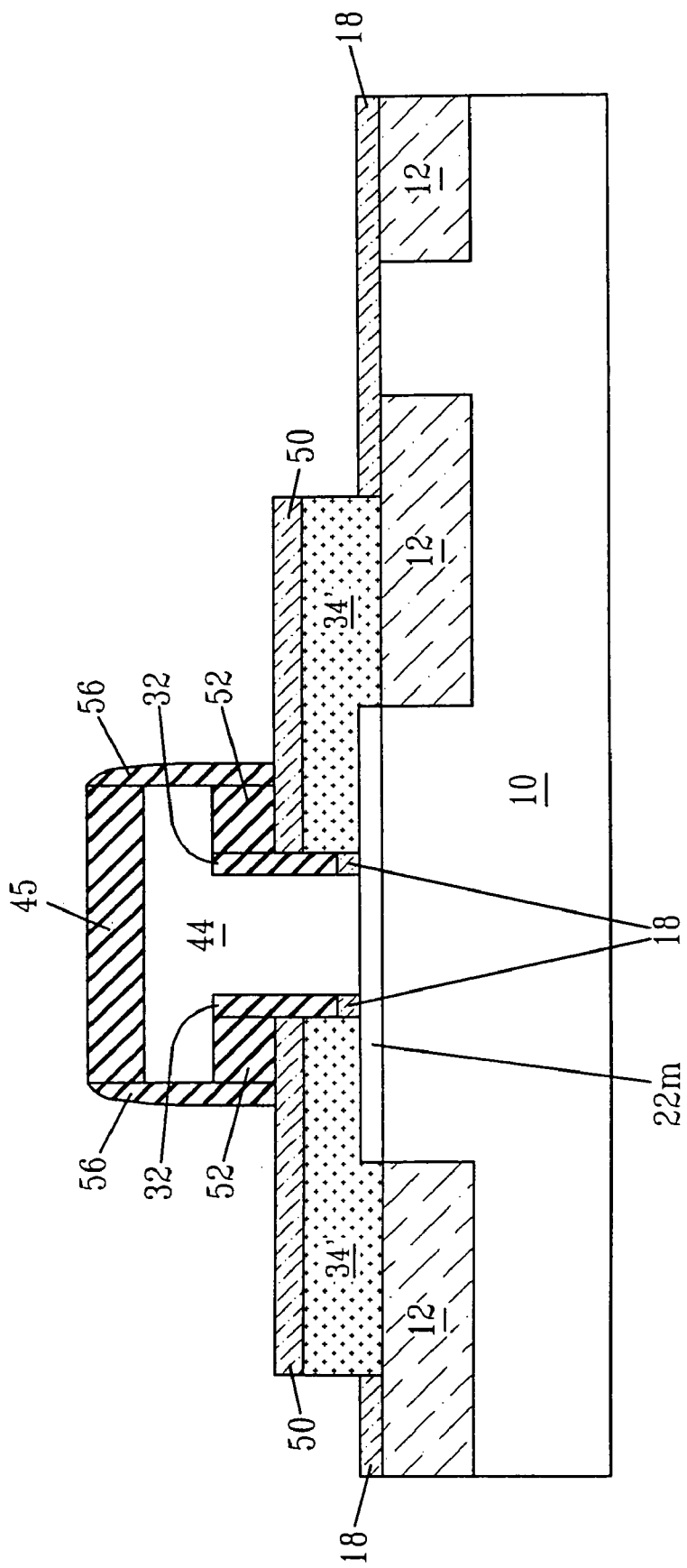
Figure 19:
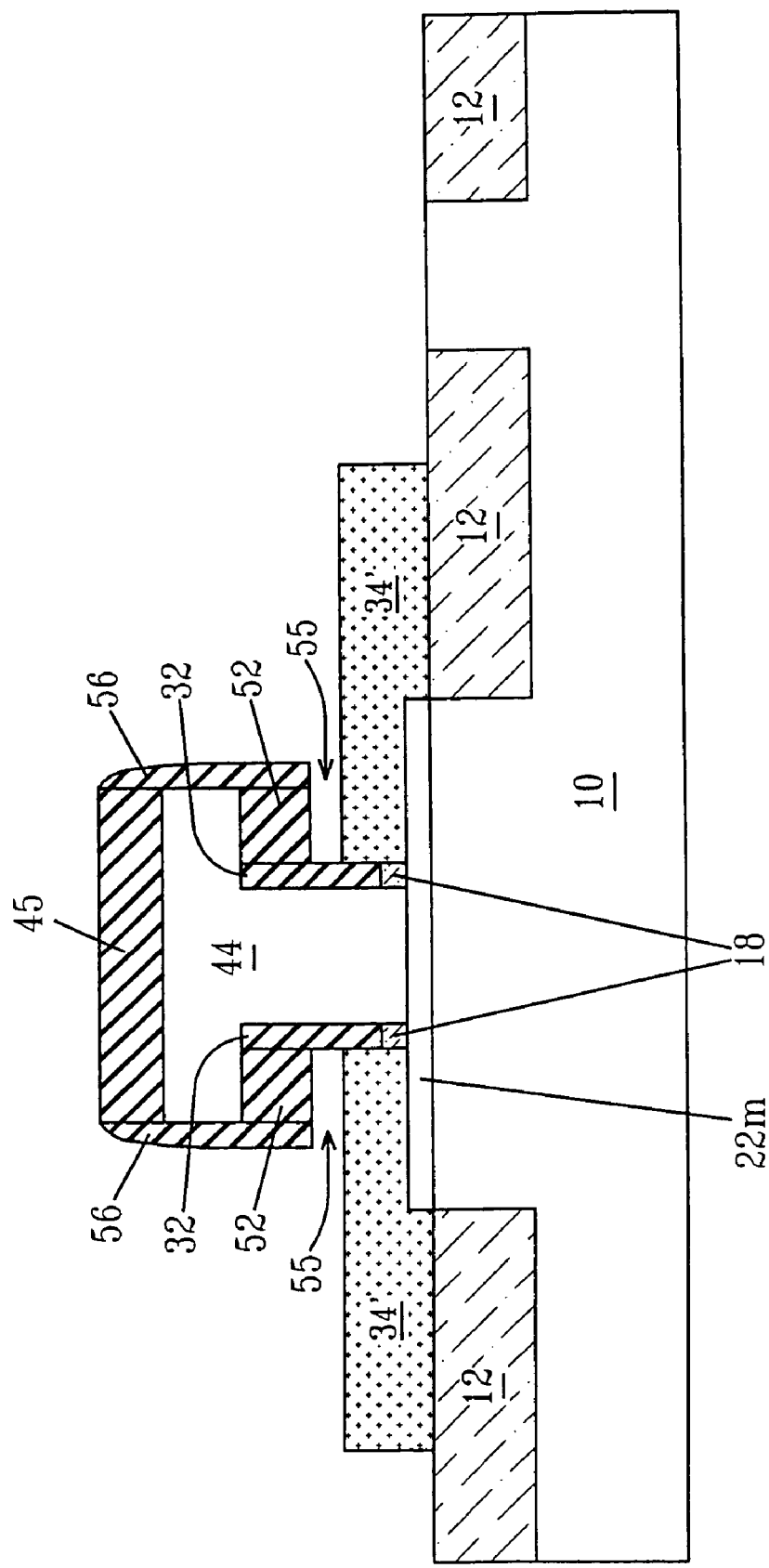

Next, and as shown in FIG. 17, emitter polysilicon 44 and a nitride cap 45 are deposited and the structure is patterned by lithography and etching. In this step of the present invention, the emitter and the raised extrinsic base are both patterned by the lithography and etching steps.

After providing the structure shown in FIG. 17, the nitride atop the sacrificial oxide layer 50 that is not protected by the upper region of the T-shaped emitter 44 and nitride cap 45 is removed utilizing a selective etching process. The selective etching process used at this point of the second embodiment of-the present invention provides the structure shown in FIG. 18. The structure shown in FIG. 18 also includes an isolation nitride spacer 56 that is formed by CVD or another like process.

The next step of the second embodiment of the present invention includes a chemical oxide removal (COR) process or an equivalent wet etch process that is capable of forming a gap or undercut region 55 in the structure. The resultant structure formed after this step of the present invention has been performed is shown, for example, in FIG. 19.

Figure 20:
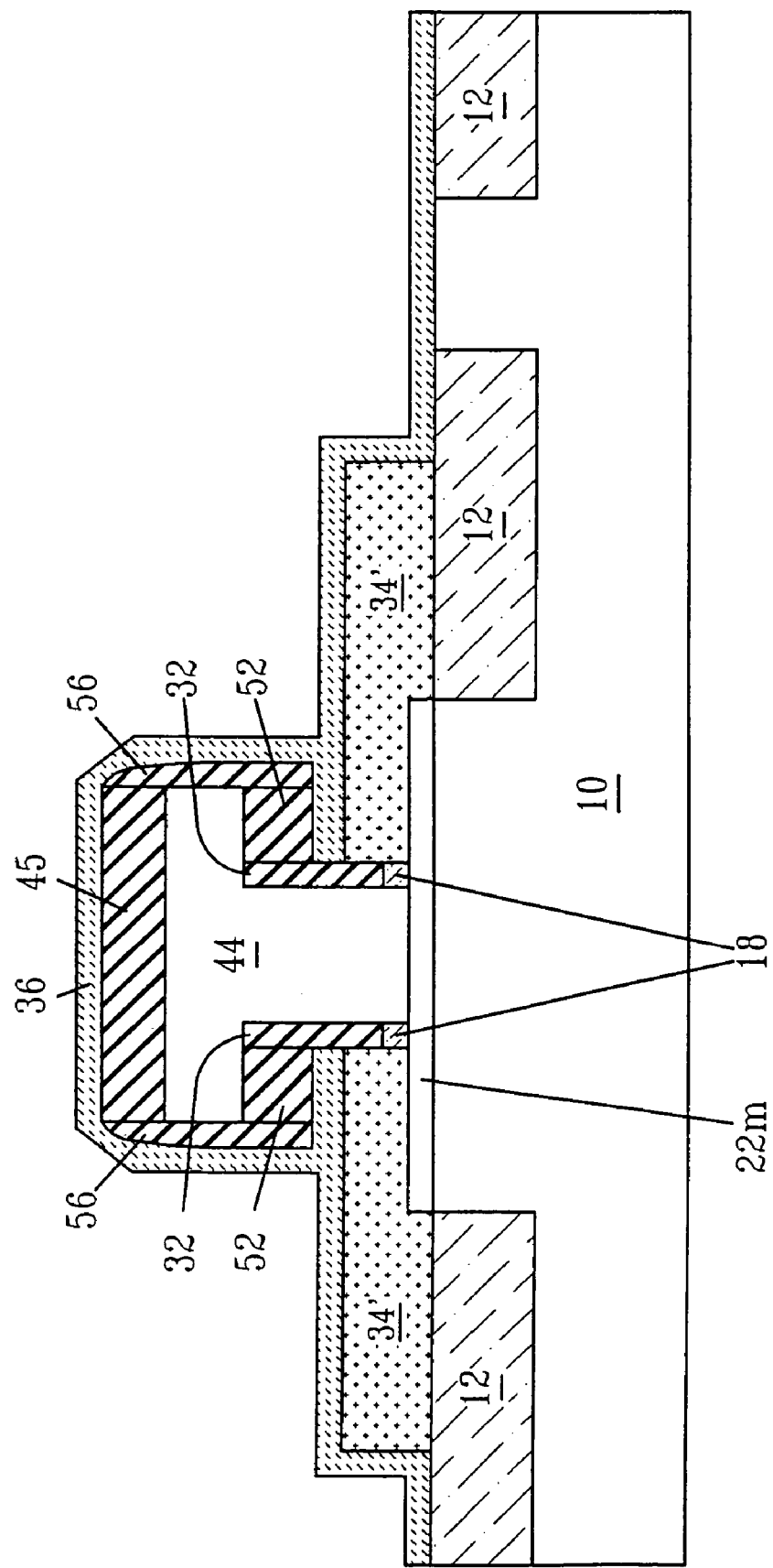

Next, a conformal layer of a refractory metal, especially Co or W, is then formed by CVD or another like process. FIG. 20 shows the structure formed after the conformal layer 36 is formed.

Figure 21:
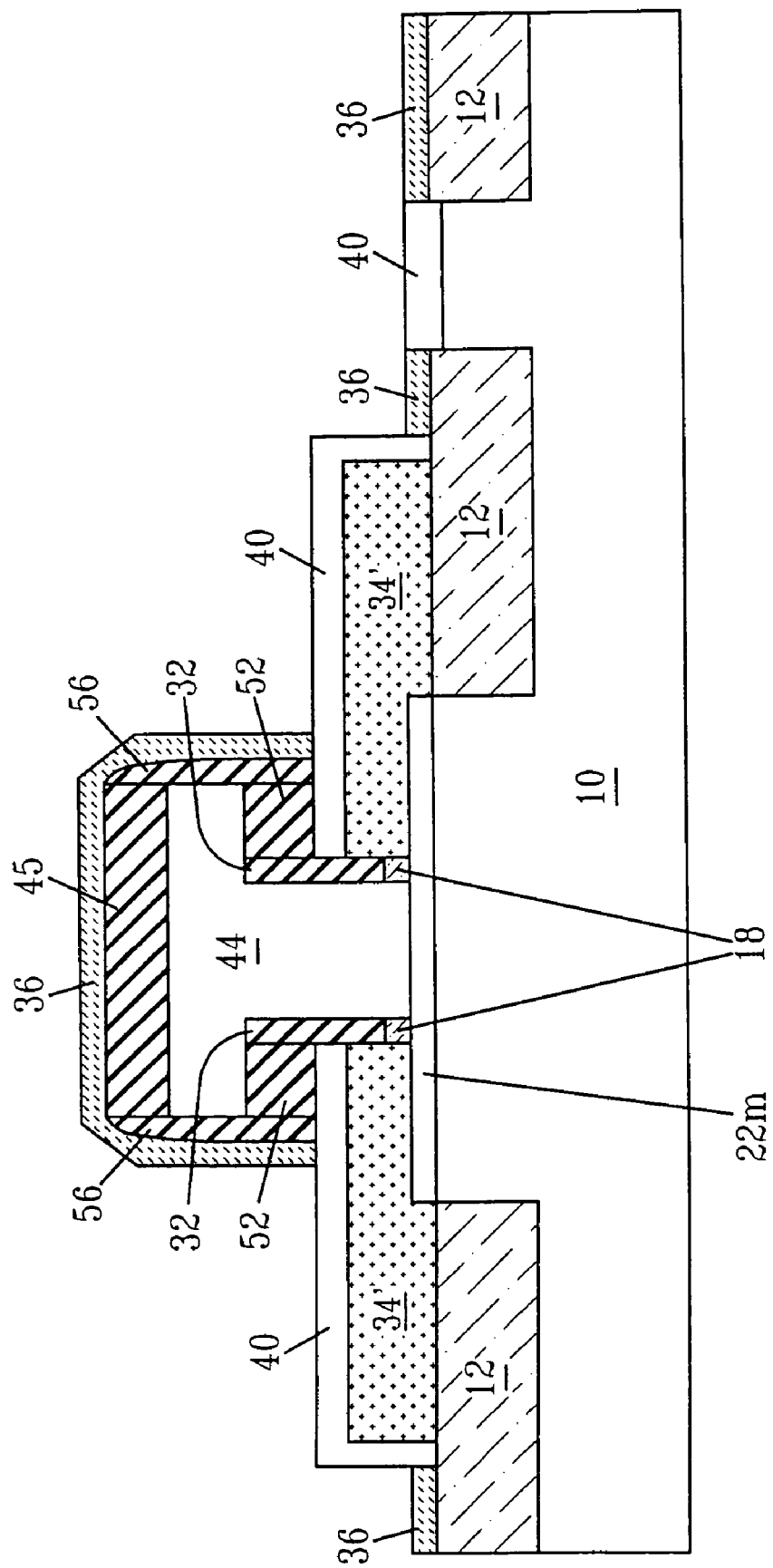

The structure shown in FIG. 20 is then subjected to an annealing process, such as described in the first embodiment, which is capable of causing the conformal layer of refractory metal 36 to react with silicon or polysilicon so as to form a silicide region 40 atop the raised extrinsic base 34". The structure formed after annealing is shown in FIG. 21. Note that silicide is formed within the gap or undercut region 55 provided above.

Figure 22:
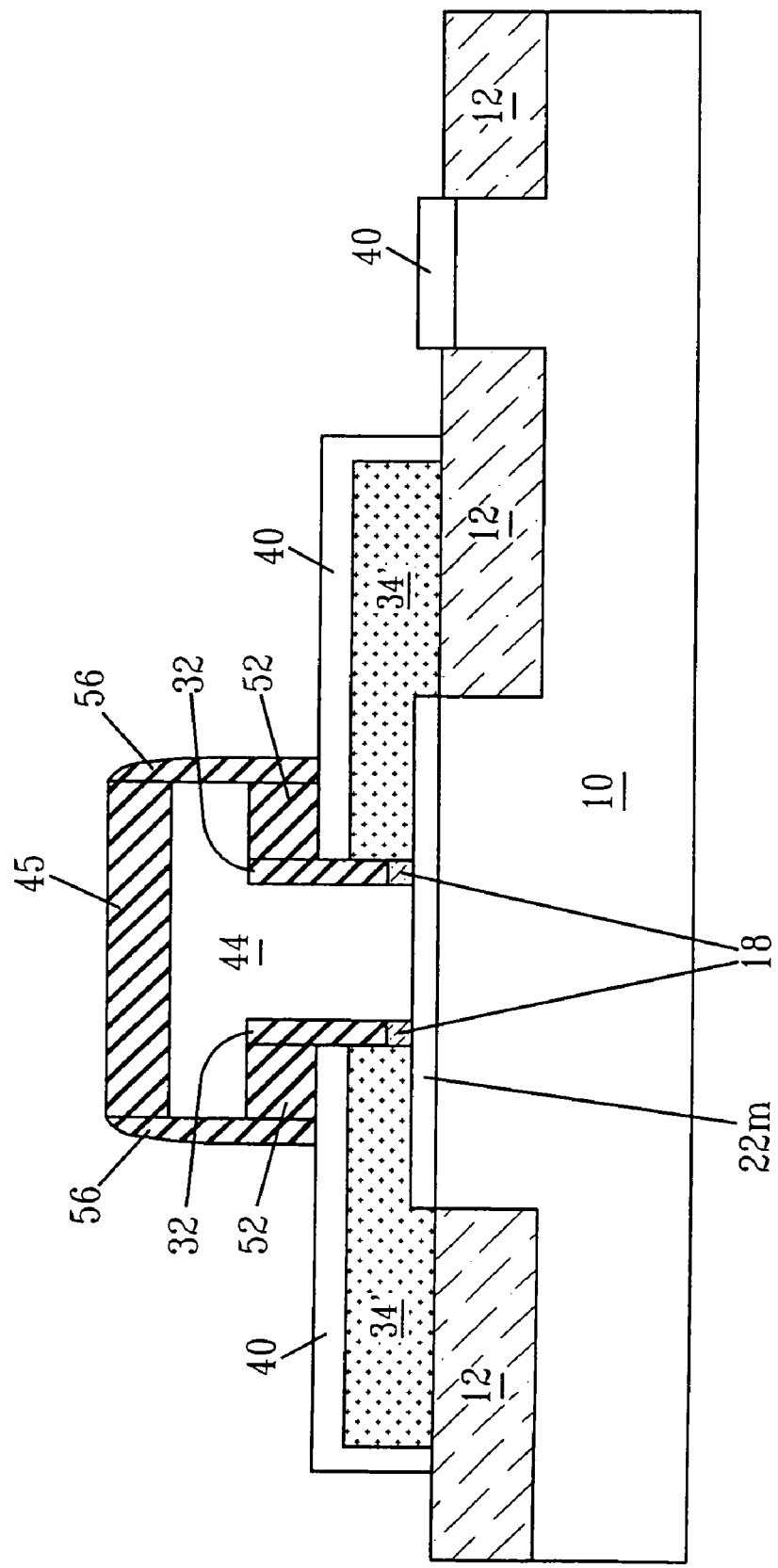

The unreacted metal is the removed utilizing a selective wet etch process providing the structure shown in FIG. 22. The structure shown in FIG. 22 includes a silicide region 40 that is self-aligned to the emitter 44 of the HBT. The inner edge of the silicide is located beneath the upper T-shaped portion of the emitter 44.

The structures shown in either FIG. 11 or FIG. 22 can be subjected to further HBT device processing steps including device contact formation. In both embodiments of the present invention, the resultant structure includes a raised extrinsic base silicide 40 that extends to the emitter 44 in a self-aligned manner. The inventive structure having the self-aligned emitter atop the raised extrinsic base lowers the base resistance of the HBT device.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

The invention claimed is:

1. A method of forming a high-performance heterojunction bipolar transistor comprising the steps of:
   forming a base region atop a Si substrate having trench isolation regions and a collector located therein, said base region including a monocrystalline region atop the Si substrate and a polycrystalline region atop the trench isolation regions;
   forming an oxide layer atop the base region;
   forming an emitter pedestal region atop the oxide layer located atop the monocrystalline region;
   forming a raised extrinsic base adjacent to said emitter pedestal region;
   forming a silicide layer atop the raised extrinsic base; and
   forming an emitter in said emitter pedestal region, said emitter is spaced apart and isolated from the raised extrinsic base and the suicide layer, wherein said silicide layer atop the raised extrinsic base extends to the emitter in a self-aligned manner.

2. The method of claim 1 wherein said step of forming the base region comprises an epitaxial growth process that is performed at a temperature of from 450° C. to 700° C.

3. The method of claim 1 wherein said step of forming said oxide layer comprises an oxidation process or deposition.

4. The method of claim 1 wherein said step of forming said emitter pedestal region comprises the steps of: depositing a polysilicon layer atop said oxide layer, depositing a nitride layer atop the polysilicon layer and patterning the polysilicon and nitride layer to form a material stack atop the oxide layer.

5. The method of claim 4 further comprising forming insulating spacers on exposed sidewalls of said material stack.

6. The method of claim 1 wherein said step of forming the raised extrinsic base comprises providing a doped semiconductor layer on at least said polycrystalline regions of said base region.

7. The method of claim 6 wherein said doped semiconductor layer is formed by an in-situ doping deposition process.

8. The method of claim 1 wherein said step of forming the silicide layer comprises the steps of: forming a refractory metal atop the raised extrinsic base and annealing at a temperature to provide the silicide layer.

9. The method of claim 8 wherein said annealing is performed using a single annealing step.

10. The method of claim 1 wherein said step of forming the emitter comprises selectively removing portions of the emitter pedestal region to provide an emitter opening to the monocrystalline region of the base and forming an emitter polysilicon in at least said emitter opening.

11. The method of claim 1 further comprising a polysilicon chemical mechanical polishing step between the steps of forming the raised extrinsic base and forming the silicide layer.

12. The method of claim 1 further comprising an oxide chemical mechanical polishing step between the steps of forming the suicide layer and forming the emitter.

* * * * *